United States Patent [19]
Oberhammer

[11] Patent Number: 6,157,682
[45] Date of Patent: Dec. 5, 2000

[54] WIDEBAND RECEIVER WITH BANDWIDTH EXTENSION

[75] Inventor: Wolfgang Oberhammer, Ottawa, Canada

[73] Assignee: Nortel Networks Corporation, Montreal, Canada

[21] Appl. No.: 09/050,128

[22] Filed: Mar. 30, 1998

[51] Int. Cl.[7] .............................. H03K 9/00; H04L 27/06; H04L 27/14; H04L 27/22

[52] U.S. Cl. .................... 375/316; 455/131; 455/313; 341/155

[58] Field of Search .................... 375/316, 285, 375/346, 349; 455/296, 302, 303, 313, 323, 131; 341/155, 157

[56] References Cited

U.S. PATENT DOCUMENTS

| | | |
|---|---|---|
| 5,659,546 | 8/1997 | Elder ........................................ 370/343 |
| 5,668,836 | 9/1997 | Smith . |
| 5,956,346 | 9/1999 | Levan ...................................... 370/480 |

*Primary Examiner*—Chi H. Pham
*Assistant Examiner*—Jean B. Corrielus

[57] ABSTRACT

A wideband receiver capable of handling the new extended A and B cellular spectrum is provided. Portions of the band are converted using analog conversion into a frequent between Fs/4 and Fs/2 where Fs is a sampling frequency of an analog-to-digital converter. Other portions of the band are converted such that when they are sampled by the analog-to-digital converter aliasing causes them to lie in the baseband frequencies between zero and Fs/2, and more particularly in baseband frequencies which do not interfere with the other converted bands.

16 Claims, 8 Drawing Sheets

WIDEBAND RECEIVER WITH BANDWIDTH EXTENSION

FIELD OF THE INVENTION

The invention relates to wideband receiver with an extended bandwidth and to a system and method for digitizing non-contiguous bandwidths such as the new extended "A band" used in North American cellular applications.

BACKGROUND OF THE INVENTION

The receive band portion of the North American cellular spectrum extends from 824 MHZ to 849 MHZ and is divided up into "A" and "B" bands for wireline and non-wireline operators. This includes a recent extension of the spectrum by an additional 5 MHZ of bandwidth. Due to legacy considerations, the spectrum extension was done in noncontiguous bands. As a result, the "A" band now consists of an A"$\overline{A}$ band extending from 824 MHZ to 835 MHZ together with an A' band extending from 845 MHZ to 846.5 MHZ.

Receivers are thus required to perform an analog-to-digital conversion on frequencies within a 22.5 MHZ band extending from 824 MHZ to 846.5 MHZ. State of the art ADCs (analog-to-digital converters) of sufficient dynamic range are capable of sampling at a sampling frequency (FS) of 65 mega samples per second. Using the lowest conversion band, (first Nyquist, frequency<FS/2), a 32.5 MHZ band can be converted.

One existing solution to dealing with the new noncontiguous A band involves the direct conversion of the entire 22.5 MHZ band. However, converting the entire band such that the highest frequency component is under 30 MHZ means that the lowest 30 KHz channel will be at or below 7.5 MHZ. Harmonics of these lowest channels generated in the analog circuits before the ADC would fall at 15, 22.5 and 30 MHZ. Hence these harmonics will interfere with other A band channels and/or B channels in the case that the receiver is tuned to receive B band signals, and this is undesirable.

A second approach is to fold the A' band such that at baseband, the A' band will result in a frequency close to the converted A"$\overline{A}$ band. With this approach, IF filter rejection is insufficient to prevent B band frequencies from falling on top of A'. This is particularly true in the filter guard band. In addition, a performance degradation is suffered by combining similar frequencies in a high linearity analog line-up.

U.S. Pat. No. 5,668,836 by Smith et al. which issued Sep. 16, 1997 entitled "Split Frequency Band Signal Digitizer and Method" discloses a receiver in which the entire A band is downconverted in a single step such that the A"$\overline{A}$ band is below half the digitizer sampling frequency FS, and the A' band is above half the digitizer sampling frequency. This signal is digitized to produce a digitized signal having a spectrum containing a replica of the A' signal in the band of interest, namely that below half the digitizer sampling frequency, due to aliasing. This approach has several problems. Firstly, it appears that the A' band ends up being folded over on top of the B band, and no mechanism for the adequate removal of the B band is suggested. Secondly, it appears likely that at least a portion of the A band will end up below FS/4 and thus will produce in-band harmonics (harmonics below FS/2). Thirdly, the frequency axis of the A' band is flipped, in other words the I and Q sidebands are reversed. This requires a modification to the hardware or software components performing demodulation.

It would be of great commercial advantage to be able to convert all of the A band at the same time and all of the B band at the same time, but not necessarily to convert all of A and B at the same time, and without causing a flip in the frequency axis, or causing the B band to interfere with the converted A band.

SUMMARY OF THE INVENTION

It is an object of the invention to obviate or mitigate one or more of the above identified disadvantages.

According to a first broad aspect, the invention provides a method of digitizing a signal having first and second non-contiguous frequency bands comprising the steps of: a) performing a first analog conversion on said signal to isolate and convert the spectrum of the first band into a first converted frequency band which lies below and FS/2 where FS is a predetermined sampling frequency; b) performing a second analog conversion on said signal to isolate and convert the spectrum of the second band into a second converted frequency band which when sampled at said predetermined frequency FS will result in a digitized signal having an alias band between 0 and FS/2 which is a replica of the second converted band which does not have its I and Q sidebands reversed, the alias band not interfering with said first converted frequency band; and c) combining said first converted signal with said second converted signal and sampling at said predetermined sampling frequency with an analog-to-digital converter.

According to a second broad aspect, the invention provides a method of digitizing a signal having a first set of one or more frequency bands and a second set of one or more frequency bands, each of said frequency bands being non-contiguous with each other, the method comprising the steps of a) for each band in said first set, performing a respective first analog conversion on said signal to isolate and convert the spectrum of the band into a respective first converted frequency band which lies below FS/2 where FS is a predetermined sampling frequency, the first converted frequency bands not interfering with each other; b) for each band in said second set, performing a respective second analog conversion on said signal to isolate and convert the spectrum of the band into a respective second converted frequency band which when sampled at said predetermined frequency FS will result in a digitized signal having a respective alias band between 0 and FS/2 which is a replica of the second converted band which does not have its I and Q sidebands reversed, the alias bands not interfering with each other or with said first converted frequency bands; and c) combining said first converted bands with said second converted bands and sampling at said predetermined sampling frequency with an analog-to-digital converter.

According to a third broad aspect, the invention provides a wideband digitizer for digitizing a signal having first and second non-contiguous frequency bands, comprising: a)first analog conversion circuitry for performing a first analog conversion on said signal to isolate and convert the spectrum of the first band into a first converted frequency band which lies below FS/2 where FS is a predetermined sampling frequency; b) second analog conversion circuitry for performing a second analog conversion on said signal to isolate and convert the spectrum of the second band into a second converted frequency band which when sampled at said predetermined frequency FS will result in a digitized signal having an alias band between 0 and FS/2 which is a replica of the second converted band which does not have its I and Q sidebands reversed, the alias band not interfering with said first converted frequency band; and c) an analog-to-digital converter for sampling a combination of the first converted band and the second converted band at said predetermined sampling frequency.

According to a fourth broad aspect, the invention provides a wideband digitizer for digitizing a signal having a first set of one or more frequency bands and a second set of frequency bands, the frequency bands being non-contiguous with each other, comprising: a) for each of said first set of frequency bands, a respective first analog conversion circuitry for performing a first analog conversion on said signal to isolate and convert the spectrum of the band into a respective first converted frequency band which lies below FS/2 where FS is a predetermined sampling frequency, the first converted frequency bands not interfering with each other; b)for each of said second set of frequency bands, a respective second analog conversion circuitry for performing a second analog conversion on said signal to isolate and convert the spectrum of the band into a respective second converted frequency band which when sampled at seLid predetermined frequency FS will result in a digitized signal having a respective alias band between 0 and FS/2 which is a replica of the second converted band which does not have its I and Q sidebands reversed, the alias bands not interfering with each other or with said first converted frequency bands; and c) an analog-to-digital converter for sampling a combination of the first converted bands and the second converted bands at said predetermined sampling frequency.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
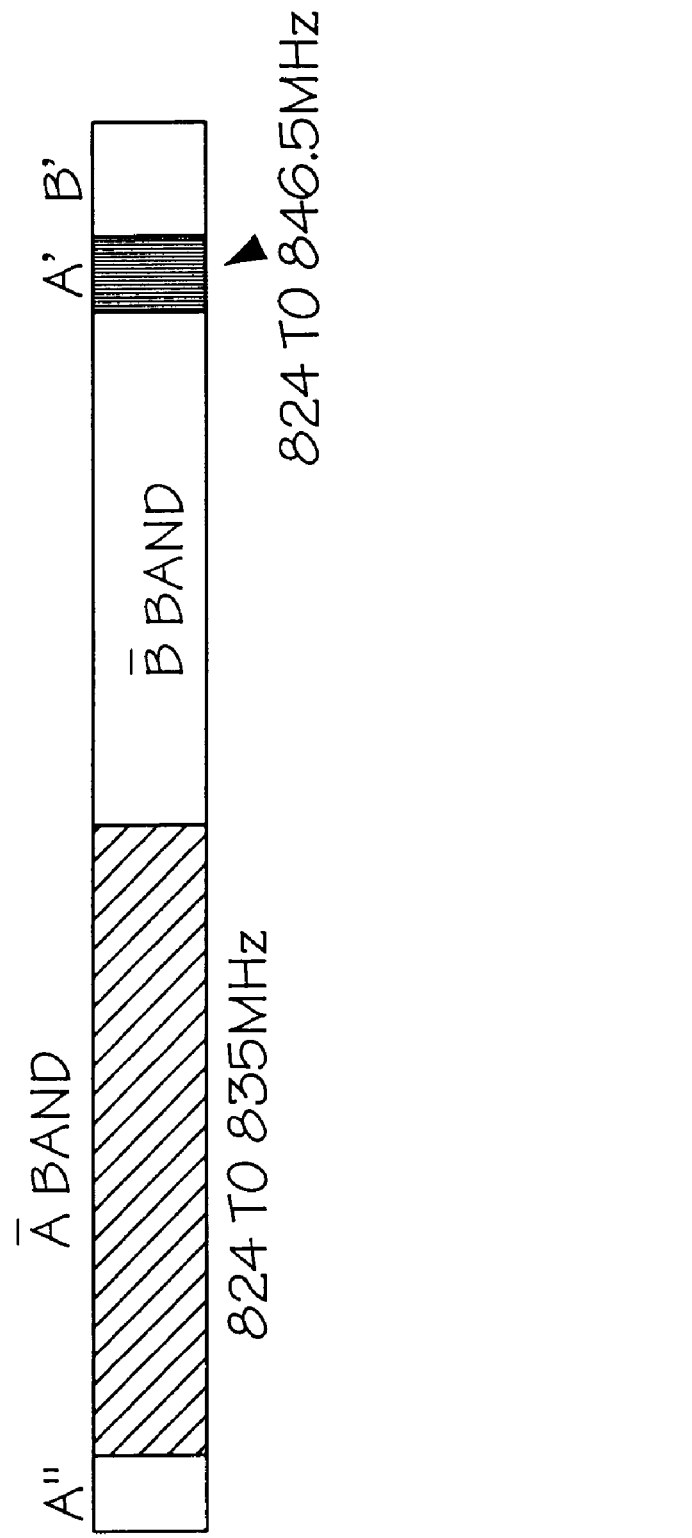
FIG. 1 is a spectrum content diagram showing the divisions of the North American cellular spectrum into A and B Bands.

Referring to FIG. 1, the new "A" band within the North American cellular spectrum comprises the combination of the original A band, labelled $\overline{A}$, which extends from 825.3 to 834.99 MHZ, an A' band which extends from 845.01 to 846.48 MHZ and an A" band which extends from 824.01 to 825 MHZ. The A" and $\overline{A}$ bands are contiguous and together will be referred to as the A"$\overline{A}$ band. The "B" band consists of the original B band, labelled B, which extends from 835.02 MHZ to 844.98 MHZ and a B' band which extends from 846.51 to 848.97 MHZ.

Figure 2:
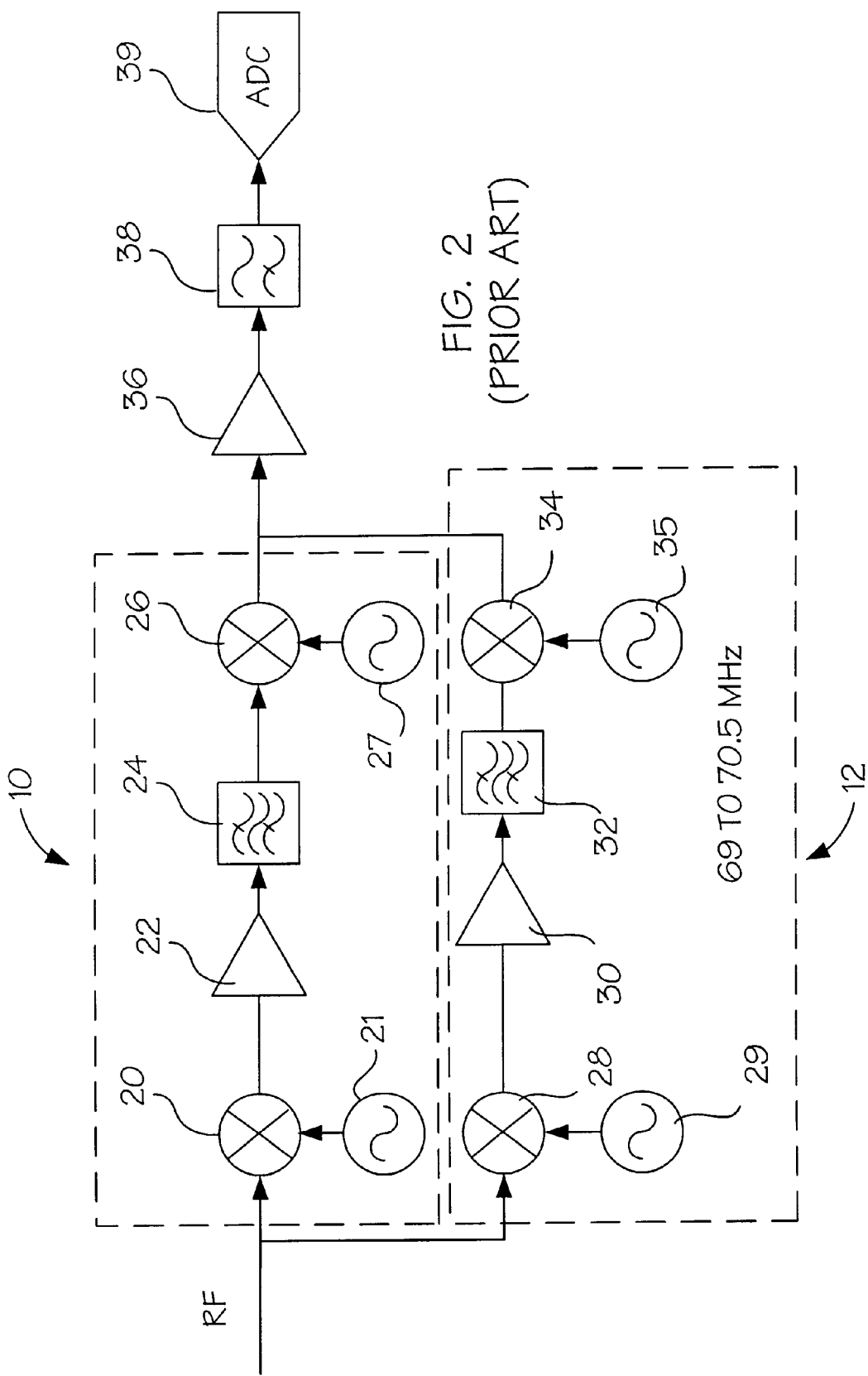
FIG. 2 is a schematic diagram of a known cellular wideband receiver.

Referring now to FIG. 2, an existing receiver design for digitizing the non-contiguous A band by employing the above identified folding of the A' band such that it ends up close to the remainder of the band is shown. A received RF signal with information content in the A band is split using a signal splitter (splitter not-shown, well known in the art) and input to two paths 10,12 which will be referred to as the A"$\overline{A}$ and the A' paths respectively.

The A"$\overline{A}$ path 10 has an RF mixer 20 connected to an oscillator 21 with a mixing frequency of 714 MHZ, an amplifier 22, an IF bandpass filter 24 with a passband between 110 and 121 MHZ, and an IF mixer 26 connected to an oscillator 27 with a mixing frequency of 94 MHZ.

The A' path has an RF mixer 28 connected to an oscillator 29 with a mixing frequency of 723 MHZ, an amplifier 30, an IF bandpass filter 32 with a passband between 122 MHZ and 123.5 MHZ, and an IF mixer connected to an oscillator 35 with a mixing frequency of 94 MHZ.

The IF mixers 26,34 have outputs which are combined at an input to an amplifier 36 connected through a baseband lowpass filter 38 having a cutoff frequency of 28.5 to an ADC 39 having a sampling frequency of 65 MHZ.

In use, path 10 performs mixing and filtering for the A"$\overline{A}$, components, path 12 performs mixing and filtering for the A' components. These are then combined, amplified, filtered and sampled in components 36,38,39. The problems with this scheme have been identified previously.

Figure 3:
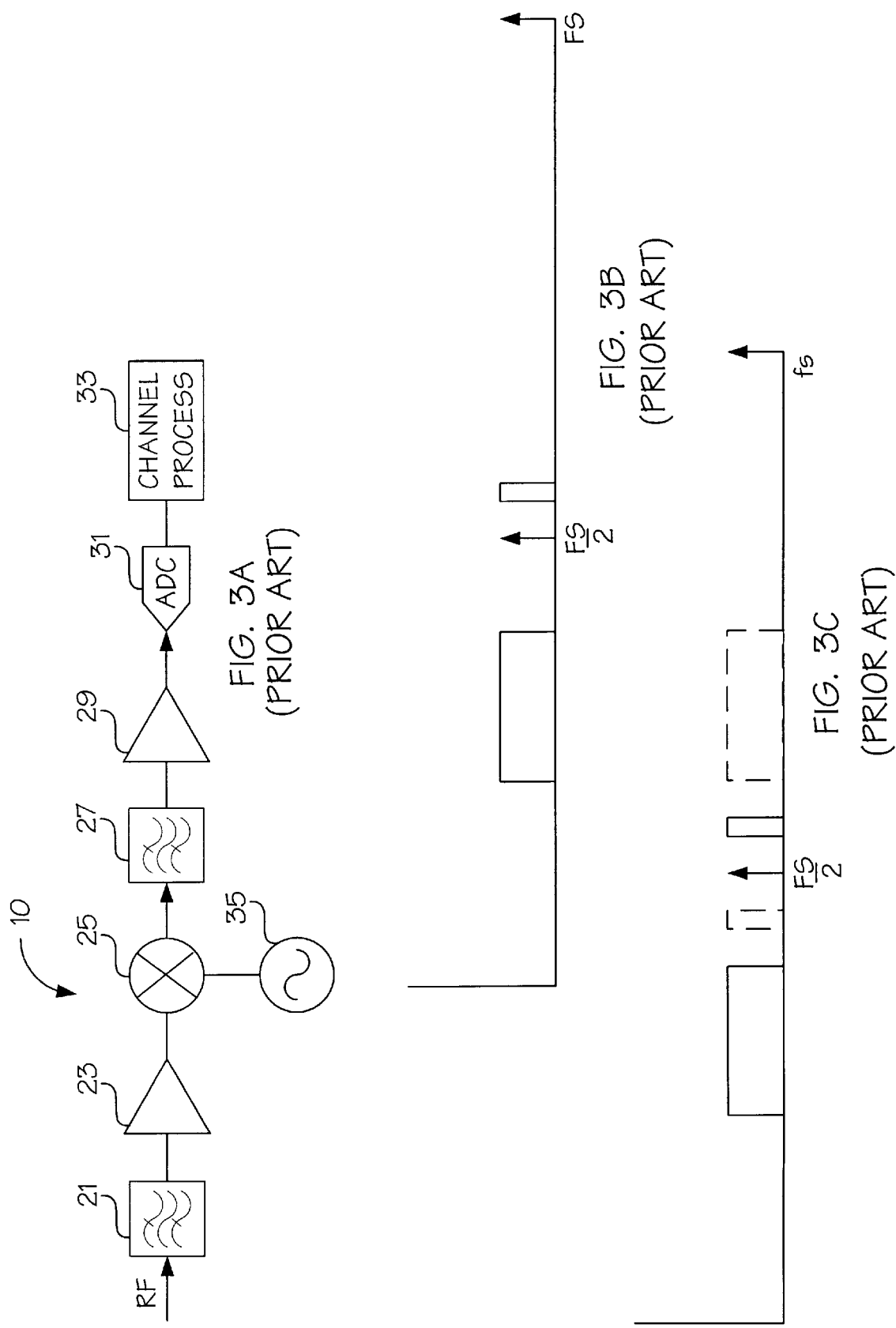
FIG. 3A is a schematic diagram of another known wideband receiver.
FIGS. 3B and 3C are spectrum content diagrams relating to the receiver of FIG. 3A.

Referring now to FIG. 3A, a receiver design disclosed in the above-referenced U.S. Pat. No. 5,668,836 is shown to include a single path consisting of a bandpass filter 21, an amplifier 23, an RF mixer 25 connected to an oscillator 35, a second filter 27, a second amplifier 29, an analog-to-digital converter 31, and a channel processing block 33. The oscillator frequency is selected such that the A band is shifted with the A"$\overline{A}$ band on one side of half the digitizer sampling frequency, and with the A' band on the other side of half digitizer sampling frequency, as illustrated in FIG. 3B. After digitization, a copy of the A' band exists below FS/2 due to digital aliasing as shown in FIG. 3C. The problems with this approach have also been identified previously.

Figure 4:
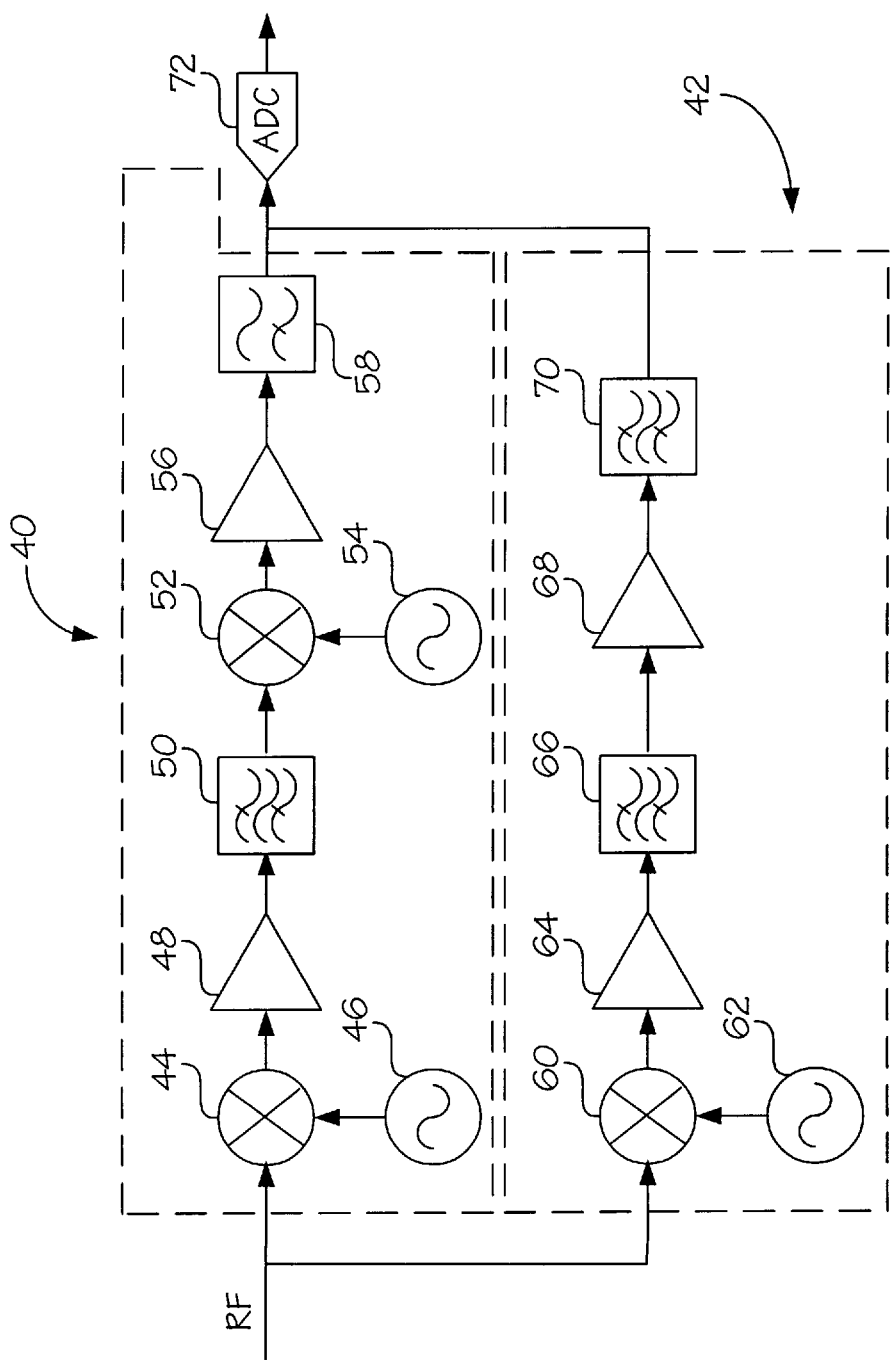
FIG. 4 is a schematic diagram of a cellular wideband receiver according to an embodiment of the invention.

Referring now to FIG. 4, a wideband receiver according to an embodiment of the invention divides an incoming RF signal into two paths generally indicated by 40,42 which will again be referred as the A"$\overline{A}$ path and the A' path respectively.

The A"$\overline{A}$ path 40 has an RF mixer 44 connected to an oscillator 46 with a mixing frequency of 712 MHZ, an amplifier 48, a IF bandpass filter 50 with a passband between 110 MHZ and 125 MHZ, an IF mixer 52 connected to an oscillator 54 with a mixing frequency of 94.5 MHZ, another amplifier 56, and a baseband lowpass filter 58 having a passband below 30.5 MHZ.

The A' path has an RF mixer 60 connected to an oscillator 62 with a mixing frequency of 776 MHZ, an amplifier 64, an IF bandpass filter 66 with a passband between 69 MHZ and 70.5 MHZ, a second amplifier 68 and a second filter 70 which may be a highpass filter for example having a passband above 32 MHZ.

The last filters 58,70 in each of the two paths 40,42 have outputs which are combined at an input to an ADC 72 having a sampling frequency FS of 64 MHZ.

Path A"$\overline{A}$ 40 functions to perform mixing and filtering on the $\overline{A}$ and A" bands such that a baseband signal between 15.5 and 30.5 MHZ is produced. The RF mixer 44 shifts the RF A"$\overline{A}$ band from being centred at 829.5 MHZ to an IF A"$\overline{A}$ band at 117.5 MHZ. The A" band is also shifted, but this is removed in the first bandpass filter 50 as are B band components. The IF mixer 52 then shifts the IF A"$\overline{A}$ from being centred at 117.5 MHZ to a baseband signal centred at 23 MHZ. The final bandpass filter 58 ensures that signals outside the range of interest are suppressed.

Path A' 42 functions to perform mixing and filtering on the A' band such that a signal in the 69 MHZ–70.5 MHZ band is produced. The RF mixer 60 shifts the RF A' band from being centred at 845.75 MHZ to an IF A' band at 69.75 MHZ. The A"$\overline{A}$ band is also shifted, but this is removed in the bandpass filter 66.

The filters 50,58,66,70 collectively perform anti-alias filtering and path isolation filtering. The anti-alias filtering (which is performed by filters 50,66 in the illustrated example) ensures that there is sufficient rejection of any components folded back into the passband. Symbolically, this anti-alias filtering may be done with one filter per channel. However, it may be more practical to realize this function with several filters and amplifiers. The path isolation filtering (which is performed by filters 58,70 in the illustrated example) ensures that signal path A"$\overline{A}$is sufficiently isolated from path A'. If the isolation is insufficient, then the signal on path A' may enter signal path A"$\overline{A}$ resulting in loss of signal and/or remixing of A with A"$\overline{A}$. While the anti-alias filtering and the path isolation filtering functions may be combined, the simplest circuit design is a SAW anti-alias filter and a lowpass filter in path A, and a SAW anti-alias filter and a highpass in path A"$\overline{A}$. To achieve the best path isolation, filters 58,70 should not be designed or deployed independently but rather should be designed and deployed together with controlled distances from one another.

Figure 5:
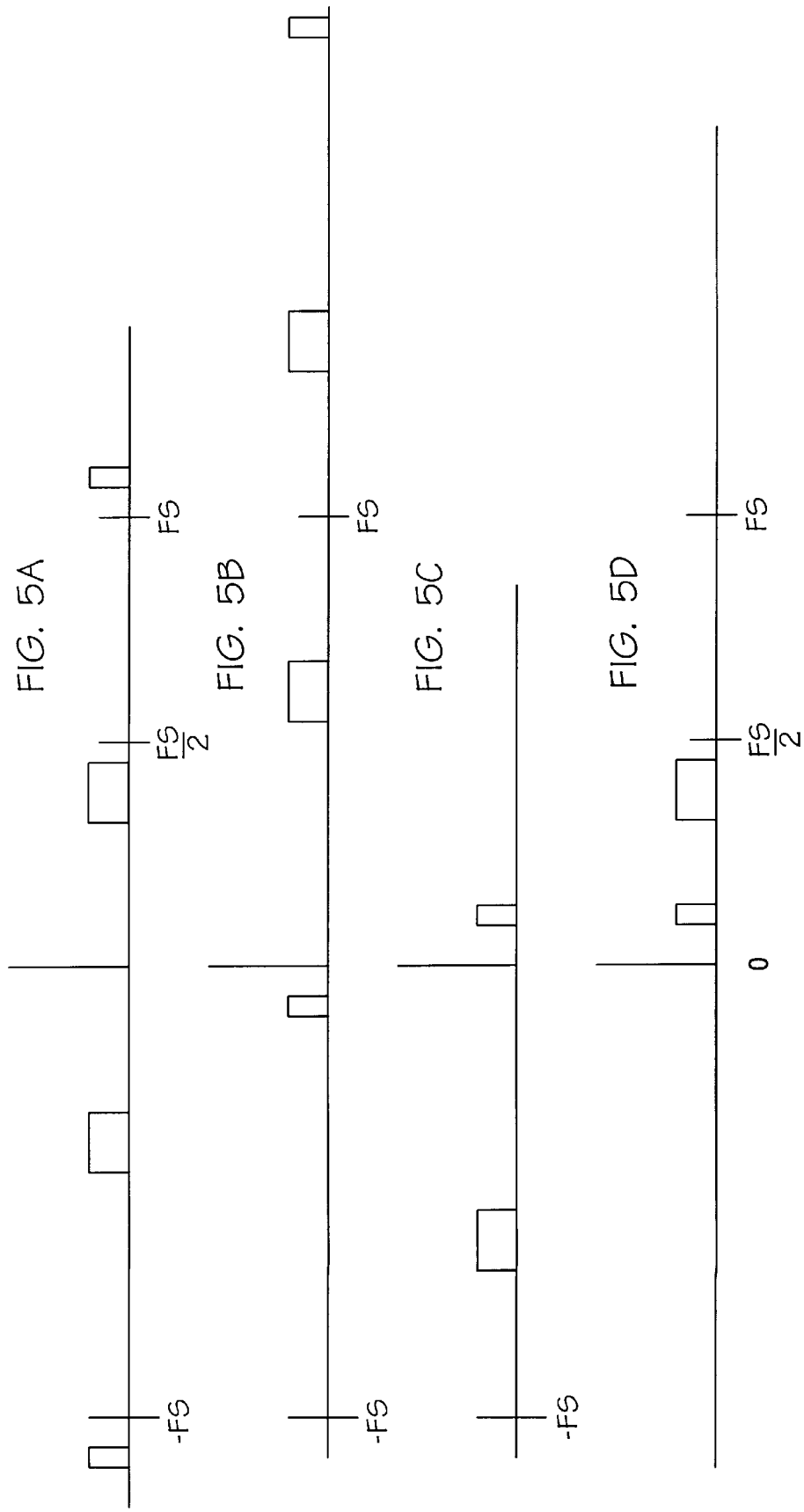
FIG. 5A is a spectrum content diagram for a converted A band centred at zero frequency.
FIGS. 5B and 5C are spectrum content diagrams of the converted A band of FIG. 5A and centred at −FS/2 and +FS/2 respectively.
FIG. 5D is a spectrum content diagram combining the spectra of FIGS. 5A, 5B and 5C.
Figure 6:
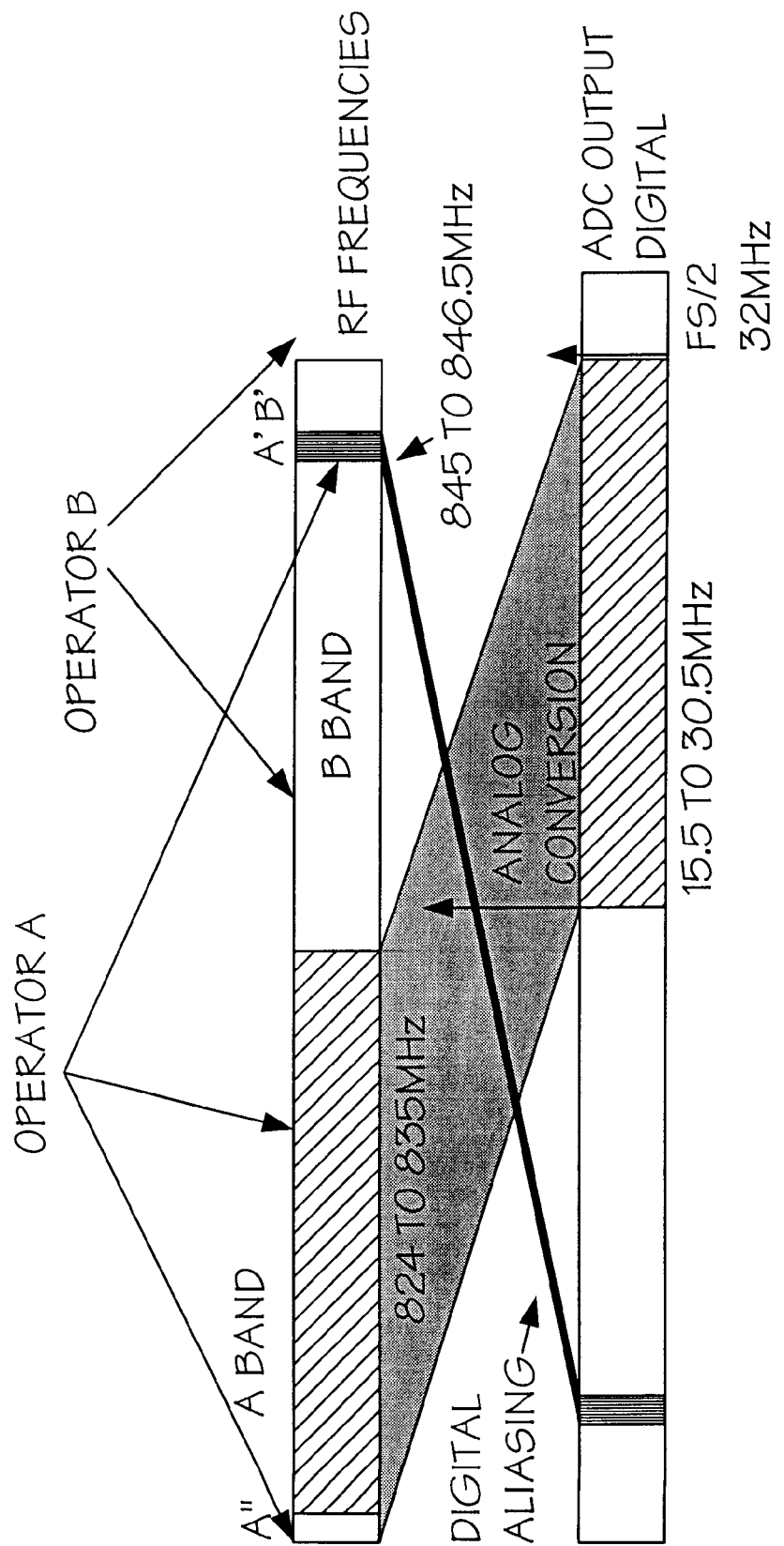
FIG. 6 is a spectrum content diagram for the A and B bands at RF, and a spectrum content diagram for the A band after being converted to baseband using the apparatus of FIG. 4.

The 15.5 MHZ to 30.5 MHZ baseband A"$\overline{A}$ signal is combined with the 69 MHZ to 70.5 MHZ A' signal and input to the ADC 72. The spectrum content of the signal being input to the ADC is shown in FIG. 5A. It is a property of ADCs that they produce an output signal whose spectrum contains spectral replicas of the input signal's spectrum centred at zero, and multiples of FS, the sampling frequency. When the spectrum of the signal being sampled has a higher frequency content than half the sampling frequency. These spectral replicas will overlap and in some cases interfere with each other, producing an effect referred to as digital aliasing. Referring to FIG. 5B, a replica of the spectrum of FIG. 5A is shown centred at FS=64 MHZ. In FIG. 5C, a portion of a replica of the spectrum of FIG. 5A is shown centred at −64 MHZ. Of course, additional replicas would also be centred at 2FS, 3FS . . . , and at −2FS, −3FS, . . . . The ADC output signal will have a spectral content as illustrated in FIG. 5D which simply consists of a sum of the spectra illustrated in FIGS. 5A,5B and 5C where only the spectrum below FS/2=32 MHZ has been shown because the digital spectrum outside the 32 MHZ range is not of interest. One can see that the digital aliasing has resulted in the A' band being reproduced in the bandwidth 5 to 6.5 MHZ. Every frequency domain signal has an I and a Q sideband. For each frequency band to be converted through analog conversion and digital aliasing, the frequency band after analog conversion should be such that when sampled at the ADC sampling frequency FS, it will result in a replica of the frequency band which does not have its I and Q sidebands reversed. The example of FIG. 5 shows how this can be achieved. FIG. 5A shows the spectrum of a signal input to the analog-to-digital converter, this including a first component below the frequency FS/2 and a second component having a frequency above FS. The spectrum includes I sidebands below the 0 frequency axis, and Q sidebands above the 0 frequency axis. When sampled at a frequency of FS, a replica of the spectrum is generated centered at frequency +FS as indicated in FIG. 5B and another replica of the spectrum is generated centered at frequency −FS as shown in FIG. 5C. The output of the ADC has a spectrum which is the sum of that shown in FIGS. 5A, 5B and 5C as shown in FIG. 5D where only the spectrum in the Q sidebands of the range 0 to FS/2 is shown. The Q sideband of the output spectrum includes the Q sideband component which was below FS/2 from the original spectrum of FIG. 5A (due to direct conversion), and a component due to aliasing (of the original Q sideband component of FIG. 5A above FS) from the replica centered at −FS shown in FIG. 5C. One can see that this component is from the Q sideband of the replica centered at −FS and as such only Q sideband signals appear in the frequency range 0 to FS/2 in FIG. 5D. Due to symmetry, only I sidebands appear in the range 0 to −FS/2 (not shown). In other words, no reversal of the I and Q sidebands occurs. FIG. 6 summarizes the manner in which the A"$\overline{A}$ and A' bands are combined in the ADC output. The A"$\overline{A}$ band is shifted to baseband through a process of analog conversion, and the A' band is shifted through a process of analog conversion and then digital aliasing.

The A' path introduces the A' band to the ADC 72 at a frequency much higher than FS. The A' band is converted to a suitable base band frequency through digital aliasing (undersampling). No information is lost notwithstanding the fact that the Nyquist sampling frequency for such a high input frequency would be much higher than the sampling frequency used. This is because the Nyquist sampling frequency does not account for the signal being a bandpase signal. It is known that effectively capture all the information content of a bandpass signal the sampling frequencies must be at least two times the bandwidth of the bandpass signal and typically must be two to four times the bandwidth of the bandpass signal.

Using the combination of direct conversion and aliasing, no compromise needs to be made in the analog circuit design which would degrade performance. At the same time, the commercially desirable capability of converting all of the A or B band is maintained. Implementing the A' path is not expensive since no IF mixer or BB amp are required.

The above described embodiment of the invention, achieves the advantageous effect of restricting the receiver to only converting frequencies from (FS/2−GB)/2 to (FS/2−GB−BW) where GB stands for a guardband required for anti-aliasing filtering, FS is the ADC sampling frequency, and BW is the bandwidth of an individual channel. Restricting the frequencies in such a manner makes amplifier and mixer linearity requirements much easier to meet. Normally, by adding this restriction, only about 15 MHZ of bandwidth could be converted with one receiver. Circuitry that converts and filters 15 MHZ as described above is suitable for receiving A" and $\overline{A}$ bands, or the B,A',B' band (or any PCS band). By adding he parallel A' path that will introduce the A' band to the ADC at a frequency higher than FS, the A' band is converted to a suitable baseband frequency by the process of aliasing (undersampling).

Using a clock frequency of FS=64 MHZ, a signal at 33.5 MHZ would alias into 30.5 MHZ. Hence, 3 MHZ of guard band exists for PCS applications and more for cellular. This guard band is sufficient for current filter technologies to provide 85 dB of protection.

In the example of FIG. 4, the IF A' band is applied to the ADC in the 69 MHZ to 70.5 MHZ band. This frequency was chosen for best guard band and converter performance balance. More generally, the concept applies to any IF A' band between FS and 1.5 FS.

Due to the frequency spacing, filters at the converter input can be of low order and low quality factor (Q). This minimizes the performance/complexity trade-off when combining the signals, provided that anti-aliasing filtering is done in the preceding filter. Only those elements of the receiver relevant to the invention are shown. It is to be understood that additional elements such as further filters and automatic gain control may be necessary.

Figure 7:
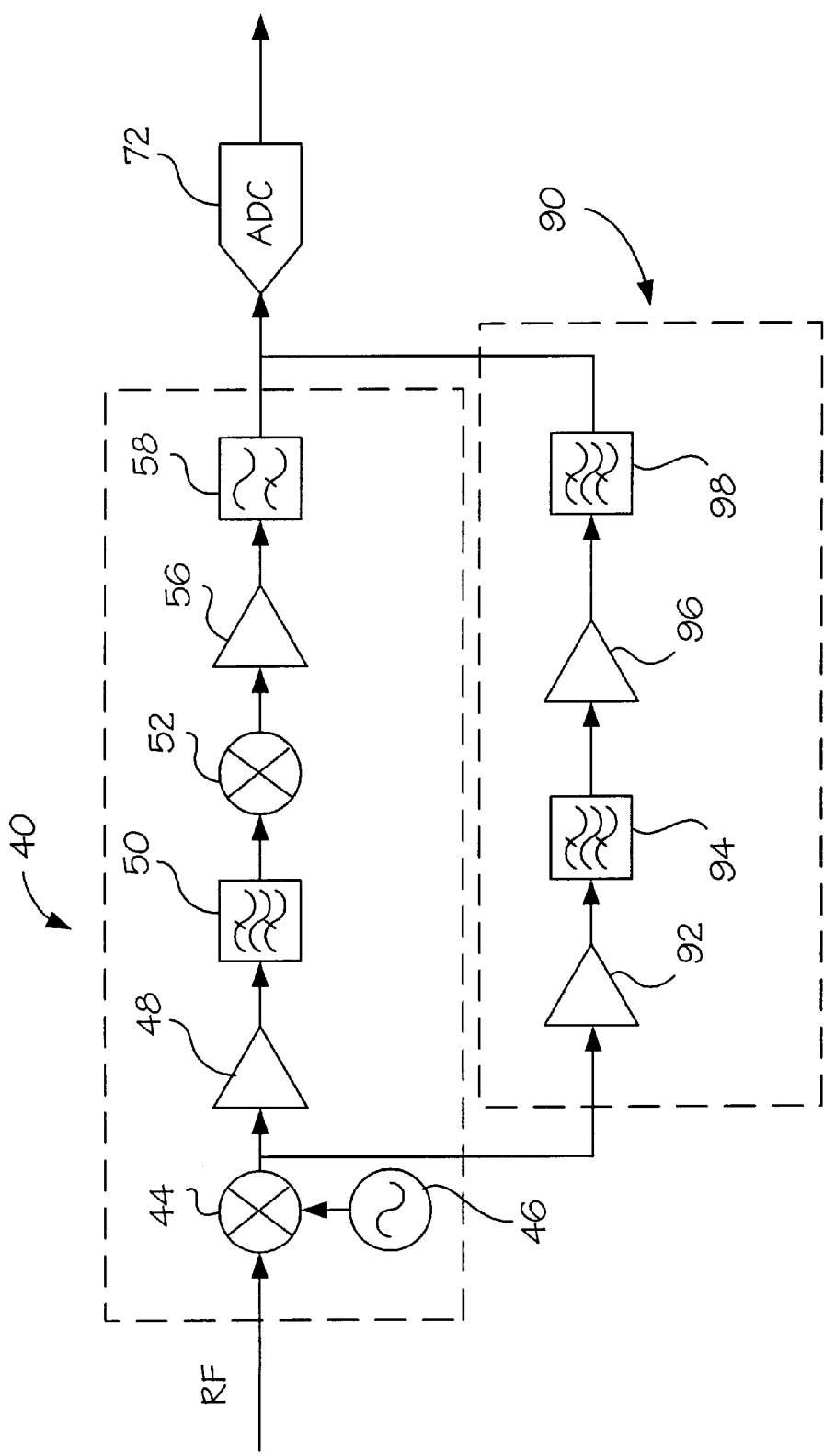
FIG. 7 is a schematic diagram of a cellular wideband receiver according to another embodiment of the invention.
Figure 8:
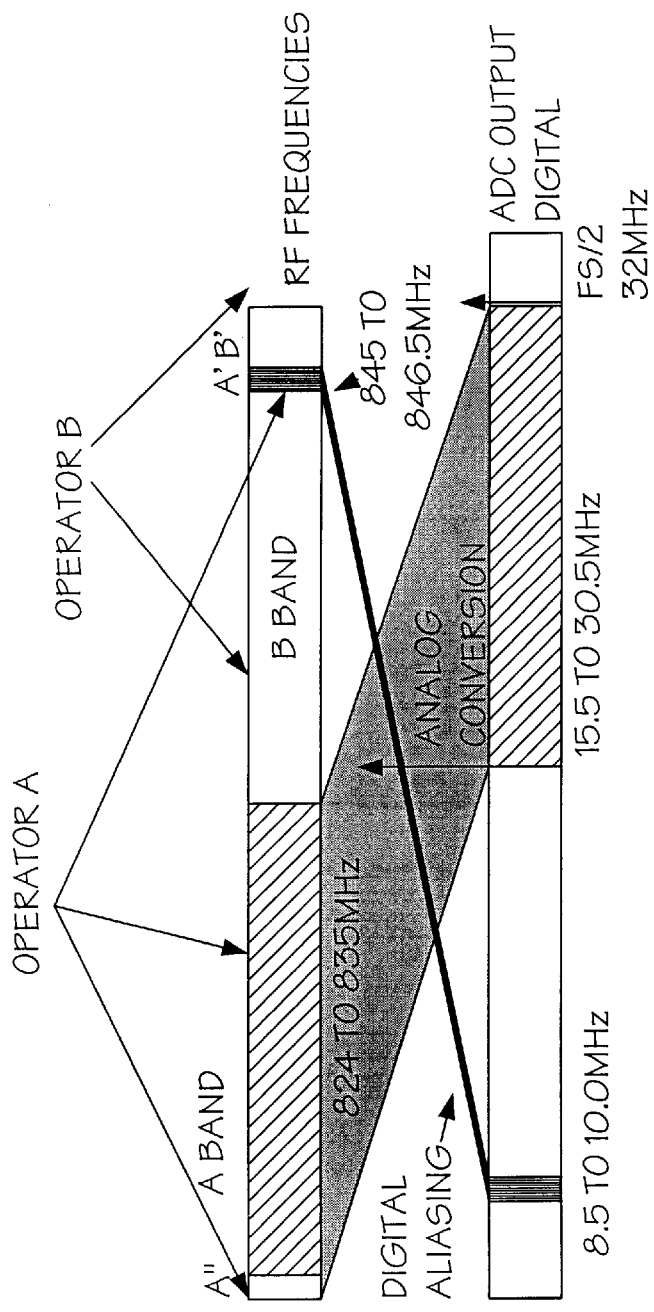
FIG. 8 is a spectrum content diagram for the A and B bands at RF, and a spectrum content diagram for the A band after being converted to baseband using the apparatus of FIG. 7.

Referring now to FIG. 7, another embodiment of the invention is shown. In this embodiment, again there are two paths 40,90 labelled path A"$\overline{A}$ and path A'. Path A"$\overline{A}$ is the same as the embodiment of FIG. 4. Path A' differs from that of the FIG. 4 embodiment in that it does not include its own RF mixer, but rather has as its input the output of the RF mixer 44 in the A"$\overline{A}$ path 40. The A' path 90 has an amplifier 92, and a bandpass filter 94 having a pass band from 135 MHZ to 136.5 MHZ. This results in the A' signal being fed to the ADC 72 in the range of 135 MHZ to 136.5 MHZ. As before, the ADC 72 samples at 64 MHZ, and a spectral replica of the input signal results in the A' band appearing at baseband in the range 7 to 8.5 MHZ. This embodiment is likely to perform less well than the FIG. 4 embodiment because of degraded performance in the ADC 72 at 130 MHZ.

As illustrated by the embodiments of FIG. 4 and FIG. 7, a number of combinations of direct conversion and aliasing can be applied to produce a digitizer signal with the desired spectral content. The exact alias frequency used is a trade-off for a particular application and performance of the ADC used.

Figure 9:
FIG. 9 is a spectrum content diagram for the North American PCS (personal communications system) spectrum.

Referring now to FIG. 9, the PCS band for basestation reception consists of an A band which extends from 1850 to 1865, a B band which extends from 1870 to 1885 MHZ, and C band which extends from 1895 to 1910 MHZ, a D band which extends from 1865 to 1870 MHZ, an E band which extends from 1885 to 1890 MHZ, and an F band which extends from 1890 to 1895. The A,B and C bands are 15 MHZ wide while the D,E and F bands 5 MHZ wide. By applying the 15 MHZ restriction as described above, a 15 MHZ band (A,B or C) and a 5 MHZ band (D,E or F) can be digitized by the direct conversion and aliasing combination.

Numerous modification and variations of the present invention are possible in light of the above teachings. It is therefore to be understood that within the scope of the appended claims, the invention may be practised otherwise than as specifically described herein.

For example, while specific examples of filtering and amplification in each path have been provided, it is to be understood that the analog processing may be achieved using any one of a large number of combinations of amplifiers and filters. The important feature of the combination used is that they achieve the desired effects of isolating the paths and performing anti-alias filtering.

What is claimed is:

1. A method of digitizing a signal having first and second non-contiguous frequency bands comprising the steps of:

a) performing a first analog conversion on said signal to isolate and convert the spectrum of the first band into a first converted frequency band which lies below FS/2 where FS is a predetermined sampling frequency;

b) performing a second analog conversion on said signal to isolate and convert the spectrum of the second band into a second converted frequency band which when sampled at said predetermined frequency FS will result in a digitized signal having an alias band between 0 and FS/2 which is a replica of the second converted band which does not have its I and Q sidebands reversed, the alias band not interfering with said first converted frequency band; and c) combining said first converted signal with said second converted signal and sampling at said predetermined sampling frequency with an analog-to-digital converter.

2. A method according to claim 1 wherein said steps a) and b) each comprise the steps of:

i) performing frequency translation;

ii) performing anti-aliasing filtering;

iii) performing path isolation filtering; and iv) performing amplification.

3. A method of digitizing a signal having a first set of one or more frequency bands and a second set of one or more frequency bands, each of said frequency bands being non-contiguous with each other, the method comprising the steps of:

a) for each frequency band in said first set, performing a respective first analog conversion on said signal to isolate and convert the spectrum of the frequency band into a respective first converted frequency band which lies below FS/2 where FS is a predetermined sampling frequency thereby producing one or more first converted frequency bands;

b) for each frequency band in said second set, performing a respective second analog conversion on said signal to isolate and convert the spectrum of the frequency band into a respective second converted frequency band which when sampled at said predetermined frequency FS will result in a digitized signal having a respective alias band between 0 and FS/2 which is a replica of the second converted frequency band which does not have its I and Q sidebands reversed thereby producing one or more second converted frequency bands which will result in one or more alias bands; and c) combining said one or more first converted frequency bands with said one or more second converted frequency bands and sampling at said predetermined sampling frequency with an analog-to-digital converter:

wherein the one or more first converted frequency bands do not interfere with each other, and wherein the one or more alias bands do not interfere with each other or with said one or more first converted frequency bands.

4. A wideband digitizer for digitizing a signal having first and second non-contiguous frequency bands, comprising:

a) first analog conversion circuitry for performing first analog conversion on said signal to isolate and convert the spectrum of the first frequency band into a first converted frequency band which lies below FS/2 where FS is a predetermined sampling frequency;

b) second analog conversion circuitry for performing a second analog conversion on said signal to isolate and convert the spectrum of the second frequency band into a second converted frequency band which when sampled at said predetermined frequency FS will result in a digitized signal having an alias band between 0 and FS/2 which is a replica of the second converted frequency band which does not have its I and Q sidebands reversed, the alias band not interfering with said first converted frequency band; and c) an analog-to-digital converter for sampling a combination of the first-converted frequency band and the second converted frequency band at said predetermined sampling frequency.

5. A digitizer according to claim 4 wherein said first analog conversion circuitry comprises, connected together in sequence, a first RF mixer; a first bandpass filter, an IF mixer, and a second lowpass or bandpass filter, wherein the first and second filters collectively substantially suppress all frequency components with the exception of those originating from said first frequency band;

wherein said second analog conversion circuitry comprises, connected together in sequence, a second RF mixer, and a third bandpass filter, and a fourth highpass or bandpass filter, wherein the third and fourth filters collectively substantially suppress all components with the exception of those originating from said second frequency band; and wherein the second and fourth filters perform path isolation.

6. A digitizer according to claim 4 wherein said first analog conversion circuitry comprises a first RF mixer and a first IF mixer, and said second analog conversion circuitry comprises a second RF mixer.

7. A digitizer according to claim 6 wherein each of said analog conversion circuitries comprise:

i) one or more filters for anti-aliasing and path isolation.

8. A digitizer according to claim 6 wherein each of said analog conversion circuitries comprise a respective anti-aliasing filter and a respective path isolation filter.

9. A digitizer according to claim 8 wherein each of said analog conversion circuitries further comprise respective amplification circuitries.

10. A digitizer according to claim 5 wherein said first RF mixer and said second RF mixer are one and the same.

11. A digitizer according to claim 6 wherein said first RF mixer and said second RF mixer are one and the same.

12. A digitizer according to claim 4 wherein said first band comprises 824 MHz to 835 MHz, and said second band comprises 845 MHz to 846.5 MHz.

13. A digitizer according to claim 5 further comprising first amplifier stage connected between the first RF mixer and the first bandpass filter, a second amplifier stage connected between the second RF mixer and the third bandpass filter, and a third amplifier stage connected before said analog-to-digit converter to amplify said combination of the first converted band and the second converted band.

14. A wideband digitizer for digitizing a signal having a first set of one or more frequency bands and a second set of frequency bands, the frequency bands being non-contiguous with each other, comprising:

a) for each frequency band of said first set of one or more frequency bands, a respective first analog conversion circuitry for performing a first analog conversion on said signal to isolate and convert the spectrum of the frequency band into a respective first converted frequency band which lies below FS/2 where FS is a predetermined sampling frequency thereby producing one or more first converted frequency bands;

b) for each frequency band cf said second set of one or more frequency bands, a respective second analog conversion circuitry for performing a second analog conversion on said signal to isolate and convert the spectrum of the frequency band into a respective second converted frequency band which when sampled at said predetermined frequency FS will result in a digitized signal having a respective alias band between 0 and FS/2 which is a replica of the second converted band which does not have its I and Q sidebands reversed thereby producing one or more second converted frequency bands which will result in one or more alias bands; and c) an analog-to-digital converter for sampling a combination of the first converted frequency bands and the second converted frequency bands at said predetermined sampling frequency;

wherein the one or more first converted frequency bands do not interfere with each other and wherein the one or more alias bands do not interfere with each other or with said one or more first converted frequency bands.

15. A digitizer according to claim 14 wherein each said analog conversion circuitry comprises one or more filters for performing anti-aliasing filtering and path isolation filtering.

16. A digitizer according to claim 14:

wherein each said first analog conversion circuitry comprises, connected together in sequence, a first RF mixer, a first bandpass filter, an IF mixer, and a second lowpass or bandpass filter, wherein the first and second filters collectively substantially suppress all components with the exception of those originating from the respective first frequency band;

wherein each said second analog conversion circuitry comprises, connected together in sequence, a second RF mixer, and a third bandpass filter which substantially suppresses all components with the exception of those originating from the respective second frequency band.

* * * * *